United States Patent
Yi et al.

(10) Patent No.: US 11,577,385 B2
(45) Date of Patent: Feb. 14, 2023

(54) ROBOT CONTROL DEVICE AND ROBOT INCLUDING THE SAME

(71) Applicant: LG ELECTRONICS INC., Seoul (KR)

(72) Inventors: Jongkwon Yi, Seoul (KR); Sunho Yang, Seoul (KR); Sunuk Kim, Seoul (KR); Chungin Jung, Seoul (KR); Chunho Cho, Seoul (KR); Byunghyuk Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 386 days.

(21) Appl. No.: 16/910,785

(22) Filed: Jun. 24, 2020

(65) Prior Publication Data

US 2021/0162588 A1   Jun. 3, 2021

(30) Foreign Application Priority Data

Nov. 28, 2019   (KR) ........................ 10-2019-0155689

(51) Int. Cl.
| | | |
|---|---|---|
| *B25J 5/00* | (2006.01) | |
| *B25J 9/16* | (2006.01) | |
| *B25J 19/00* | (2006.01) | |
| *B25J 9/00* | (2006.01) | |

(52) U.S. Cl.
CPC .............. *B25J 9/161* (2013.01); *B25J 5/007* (2013.01); *B25J 9/0009* (2013.01); *B25J 19/0054* (2013.01)

(58) Field of Classification Search
CPC ...... B25J 19/0054; B25J 9/161; B25J 9/0009; B25J 5/007; H05K 7/1432; H05K 7/1457; H05K 7/10
See application file for complete search history.

(56) References Cited

U.S. PATENT DOCUMENTS

| | | | | |
|---|---|---|---|---|
| 9,853,468 | B2* | 12/2017 | Ireland | H02J 7/0042 |
| 9,929,588 | B2* | 3/2018 | Ireland | A47L 9/2873 |
| 10,028,401 | B2* | 7/2018 | Shaw | H05K 7/10 |
| 10,500,730 | B2* | 12/2019 | Gildert | B25J 9/1679 |
| 2022/0066456 | A1* | 3/2022 | Ebrahimi Afrouzi | B25J 9/1697 |

OTHER PUBLICATIONS

Schneider et al., Engineering Test Coverage on Complex Sockets, 2008, IEEE, p. 1-9 (Year: 2008).*
Garcia et al., Reusable electronics and adaptable communication as implemented in the odin modular robot, 2009, IEEE, p. 1152-1158 (Year: 2009).*
Weller et al., An optocoupled poseable ball and socket joint for computationally enhanced construction kits, 2009, IEEE, p. 1-6 (Year: 2009).*
Bennett et al., Design of a Myoelectric Transhumeral Prosthesis, 2016, IEEE, p. 1868-1879 (Year: 2016).*

* cited by examiner

*Primary Examiner* — McDieunel Marc
(74) *Attorney, Agent, or Firm* — Ked & Associates, LLP

(57) ABSTRACT

A robot control device for a robot comprises a case and a connector board which is coupled to the case and includes a plurality of connectors which are disposed in a first region and a second region adjacent laterally to the first region. The plurality of the connectors may comprise a power connector which is disposed at a bottom of one of the first region or the second region and is coupled with a power supplier; and a processor connector which is disposed in a region different from that of the power supplier and is coupled with a processor.

21 Claims, 12 Drawing Sheets

ROBOT CONTROL DEVICE AND ROBOT INCLUDING THE SAME

CROSS-REFERENCE TO RELATED APPLICATION

This application claims priority under 35 U.S.C. § 119 to Korean Application No. 10-2019-0155689 filed on Nov. 28, 2019, whose entire disclosure is hereby incorporated by reference.

BACKGROUND

1. Field

The present disclosure relates to a robot control device and a robot including the same.

2. Background

A robot has been developed for industrial use and has been responsible for a part of factory automation. Recently, fields to which the robot is applied are further spread. For example, a medical robot, an aerospace robot, etc., are being developed and a home robot is being made which can be used for household use. Among these robots, a robot capable of driving itself is called a mobile robot.

As there is a requirement for a service capable of providing users with convenience by using the mobile robot, the mobile robot which serves food or delivers goods is being developed. Such a mobile robot must have its low height for the purpose of driving stability. However, since parts used to control the robot generally have their standardized sizes, there is a limitation in limiting the height of the robot. Also, if the parts are densely disposed for the control of the robot size, heat generated inside the robot cannot be easily discharged to the outside. Therefore, there is a requirement for an effective design method capable of reducing the height of the robot without degrading the performance of the robot.

BRIEF DESCRIPTION OF THE DRAWINGS

The embodiments will be described in detail with reference to the following drawings in which like reference numerals refer to like elements wherein.

DETAILED DESCRIPTION

Figure 1:
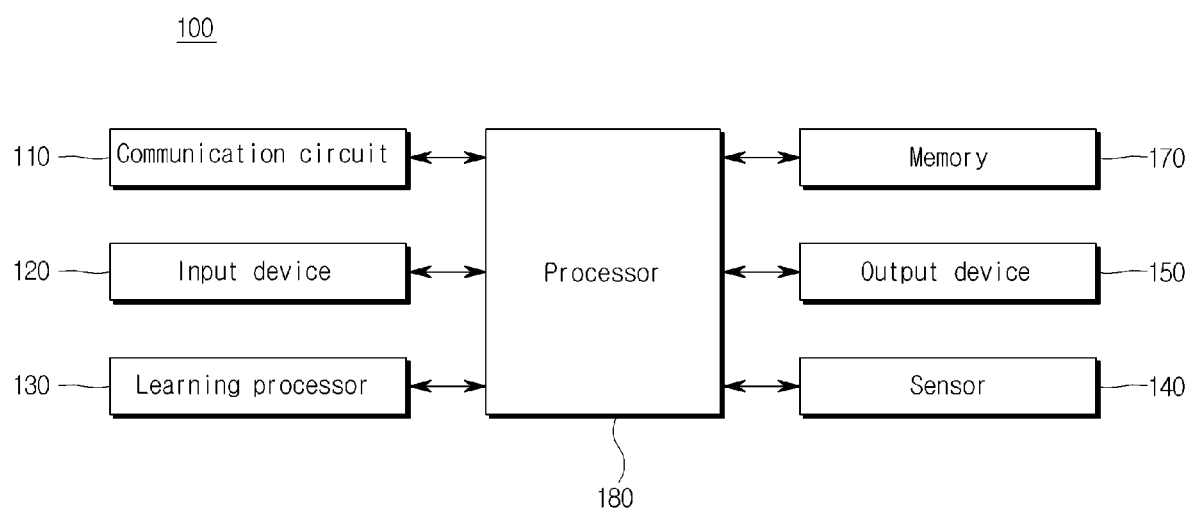
FIG. 1 shows an AI device according to an embodiment of the present invention.

Artificial intelligence refers to a field of studying artificial intelligence or methodology for making artificial intelligence, and machine learning refers to a field of defining various issues dealt with in the field of artificial intelligence and studying methodology for solving the various issues. The machine learning is defined as an algorithm that enhances the performance of a certain task through steady experience with the certain task.

An artificial neural network (ANN) is a model used in the machine learning and may mean all of the models which have a problem-solving ability and are composed of artificial neurons (nodes) that form a network by synaptic connection. The artificial neural network may be defined by a connection pattern between neurons of different layers, a learning process for updating model parameters, and an activation function for generating an output value.

The artificial neural network may include an input layer and an output layer, and optionally one or more hidden layers. Each layer includes one or more neurons, and the artificial neural network may include a synapse that connects a neuron to a neuron. Each neuron in the artificial neural network may output a function value of an activation function for input signals, a weight, and a bias input through the synapse.

The model parameter means a parameter determined by learning and includes the weight of the synaptic connection and bias of the neuron, etc. In addition, a hyper parameter means a parameter to be set before learning in a machine learning algorithm, and includes a learning rate, the number of times of the repetition, a mini batch size, an initialization function, and the like.

The purpose of the learning of the artificial neural network is regarded as determining a model parameter that minimizes a loss function. The loss function may be used as an index for determining an optimal model parameter in the learning process of the artificial neural network.

The machine learning may be classified into supervised learning, unsupervised learning, and reinforcement learning on the basis of a learning method. The supervised learning may refer to a method of training the artificial neural network in a state in which a label for learning data is given. The label may mean a correct answer (or a result value) that the artificial neural network must infer when the learning data is input to the artificial neural network. The unsupervised learning may refer to a method of training the artificial neural network in a state in which a label for learning data is not given. The reinforcement learning may refer to a learning method of training an agent defined in a certain environment to select a behavior or a behavior sequence that maximizes the cumulative reward in each state.

Machine learning, which is implemented by a deep neural network (DNN) including a plurality of hidden layers of the artificial neural networks, is called deep learning, and the deep learning is part of the machine learning. Hereinafter, the machine learning is used as a meaning including the deep running.

A robot may refer to a machine that automatically processes or operates a given task by its own ability. In particular, a robot having a function of recognizing an environment, of making a self-determination, and of performing operation may be referred to as an intelligent robot. Robots may be classified into industrial robots, medical robots, home robots, military robots, and the like according to the use purpose or field.

The robot can be equipped with a manipulator including an actuator or a motor and can perform various physical operations such as moving a robot joint. In addition, a movable robot may include a wheel, a brake, a propeller, and the like and may travel on the ground or fly in the air.

Autonomous driving refers to a technology enabling a vehicle to travel on its own accord. An autonomous vehicle refers to a vehicle that travels without a user's operation or with a minimum manipulation of the user. For example, the autonomous driving may include a technology for maintaining a lane while driving, a technology for automatically controlling a speed, such as adaptive cruise control, a technique for automatically traveling along a predetermined route, and a technology for automatically setting and traveling a route when a destination is set.

The vehicle may include a vehicle having only an internal combustion engine, a hybrid vehicle having both an internal combustion engine and an electric motor, and an electric vehicle having only an electric motor, and may include not only an automobile but also a train, a motorcycle, and the like. Here, the autonomous vehicle may be regarded as a robot having an autonomous driving function.

Virtual reality (VR), augmented reality (AR), and mixed reality (MR) are collectively referred to as extended reality. The VR technology provides a real-world object and background only in the form of a CG image, the AR technology provides a virtual CG image on a real object image, and the MR technology is a computer graphic technology that mixes and combines virtual objects into the real world.

The MR technology is similar to the AR technology in that the real object and the virtual object are shown together. However, in the AR technology, the virtual object is used in the form that complements the real object, whereas in the MR technology, the virtual object and the real object are used in an equal manner.

An XR technology may be applied to a head-mount display (HMD), a head-up display (HUD), a mobile phone, a tablet PC, a laptop computer, a desktop computer, a TV, a digital signage, and the like. A device to which the XR technology is applied may be referred to as an XR device. FIG. 1 shows an AI device according to an embodiment of the present invention.

The AI device 100 may be implemented by a stationary device or a mobile device, such as a TV, a projector, a mobile phone, a smartphone, a desktop computer, a notebook, a digital broadcasting terminal, a personal digital assistant (PDA), a portable multimedia player (PMP), a navigation system, a tablet PC, a wearable device, a set-top box (STB), a DMB receiver, a radio, a washing machine, a refrigerator, a desktop computer, a digital signage, a robot, a vehicle, and the like. Referring to FIG. 1, the AI device 100 may include a communication circuit 110, an input device 120, a learning processor 130, a sensor 140, an output device 150, a memory 170, and a processor 180.

The communication circuit 110 may transmit and receive data to and from external devices such as other AI devices 100a to 100e or an AI server 200 by using wire/wireless communication technology. For example, the communication circuit 110 may transmit and receive sensor information, a user input, a learning model, and a control signal, etc., to and from external devices. Here, the communication technology used by the communication circuit 110 includes Global System for Mobile communication (GSM), Code Division Multi Access (CDMA), Long Term Evolution (LTE), fifth generation communication (5G), Wireless LAN (WLAN), Wireless Fidelity (Wi-Fi), Bluetooth™, Radio Frequency Identification (RFID), Infrared Data Association (IrDA), ZigBee, Near Field Communication (NFC), and the like.

The input device 120 may obtain various types of data. Here, the input device 120 may include a camera for inputting an image signal, a microphone for receiving an audio signal, and a user input unit for receiving information from a user. Here, the camera or the microphone may be treated as a sensor, and the signal obtained from the camera or the microphone may be referred to as sensing data or sensor information.

The input device 120 may obtain a learning data for model learning and an input data, etc., to be used when an output is obtained by using the learning model. The input device 120 may obtain raw input data. In this case, the processor 180 or the learning processor 130 may extract an input feature by preprocessing the input data.

The learning processor 130 may train a model composed of the artificial neural networks by using the learning data. Here, the trained artificial neural network may be referred to as a learning model. The learning model may be used to infer a result value for a new input data instead of the learning data, and the inferred value may be used as a basis for determination to perform a certain operation.

Here, the learning processor 130 may perform AI processing together with a learning processor 240 of the AI server 200. Here, the learning processor 130 may include a memory integrated or implemented in the AI device 100. Alternatively, the learning processor 130 may be implemented by using the memory 170, an external memory directly coupled to the AI device 100, or a memory maintained in an external device.

The sensor 140 may obtain at least one of information on the inside of the AI device 100, information on ambient environment of the AI device 100, and user information. Here, the sensor 140 may be composed in one or more combinations of a proximity sensor, an illuminance sensor, an acceleration sensor, a magnetic sensor, a gyro sensor, an inertial sensor, an RGB sensor, an IR sensor, a fingerprint sensor, an ultrasonic sensor, an optical sensor, a microphone, a lidar, and a radar, etc.

The output device 150 may generate an output related to a visual sense, an auditory sense, or a tactile sense. Here, the output device 150 may include a display for visually outputting information, a speaker for acoustically outputting information, and a haptic actuator for tactually outputting information. For example, the display may output images or videos, the speaker may output voice or sound, and the haptic actuator may cause vibration.

The memory 170 may store data that supports various functions of the AI device 100. For example, the memory 170 may store input data obtained by the input device 120, learning data, a learning model, a learning history, etc. The memory 170 may include at least one of a flash memory type memory, a hard disk type memory, a multimedia card micro type memory, a card type memory (for example, SD or XD memory, etc.), a magnetic memory, a magnetic disk, an optical disk, a random access memory (RAM), a static random access memory (SRAM), a read-only memory (ROM), a programmable read-only memory (PROM), an electrically erasable programmable read only memory (EPMROM).

The processor 180 may determine at least one executable operation of the AI device 100 on the basis of information that is determined or generated by using a data analysis algorithm or the machine learning algorithm. The processor 180 may control the components of the AI device 100 and perform the determined operation.

To this end, the processor 180 may request, search, receive, or utilize data of the learning processor 130 or the memory 170. The processor 180 may control the components of the AI device 100 such that operations which are predicted or are determined to be desirable among the at least one executable operation are performed. Here, when the processor 180 needs to be associated with an external device in order to perform the determined operation, the processor 180 may generate a control signal for controlling the corresponding external device and transmit the generated control signal to the corresponding external device.

The processor 180 may obtain intention information for the user input and may determine user's requirements based on the obtained intention information. Here, the processor 180 may obtain intention information corresponding to the user input by using at least one of a speech to text (STT) engine for converting voice input into a text string or a natural language processing (NLP) engine for obtaining intention information of a natural language.

Here, at least a portion of at least one of the STT engine or the NLP engine may be composed of an artificial neural network trained according to the machine learning algorithm. At least one of the STT engine or the NLP engine may be trained by the learning processor 130, may be trained by the learning processor 240 of the AI server 200, or may be trained by their distributed processing.

The processor 180 may collect history information including operation contents of the AI device 100 or a user's feedback on the operation, and the like, and store the history information in the memory 170 or in the learning processor 130, or transmit the history information to the external device such as the AI server 200, etc. The collected history information may be used to update the learning model.

The processor 180 may control at least some of the components of the electronic device 100 in order to execute an application program stored in the memory 170. In addition, the processor 180 may operate two or more of the components included in the AI device 100 in combination with each other in order to execute the application program.

Figure 2:
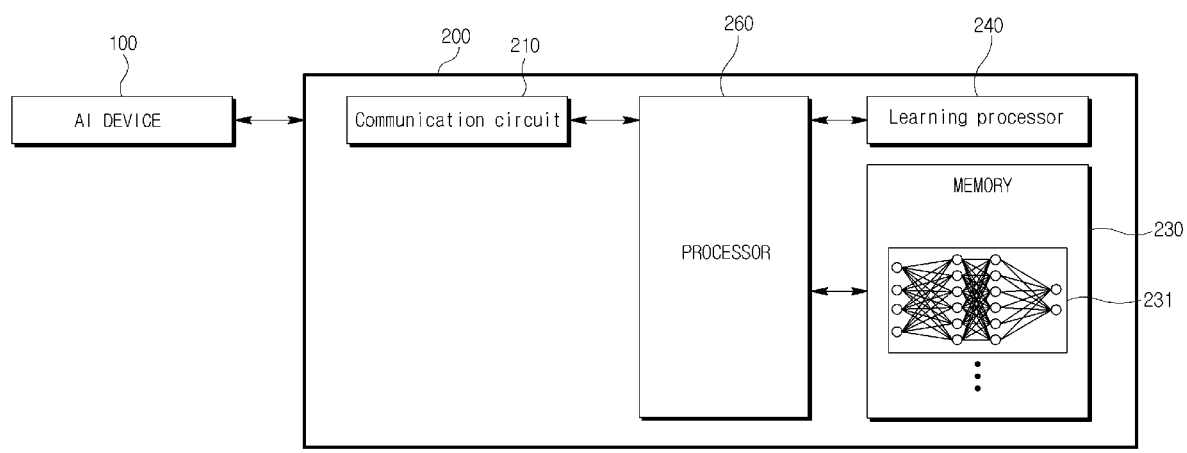
FIG. 2 shows an AI server according to the embodiment of the present invention.

FIG. 2 shows the AI server according to the embodiment of the present invention. Referring to FIG. 2, the AI server 200 may mean a device which trains the artificial neural network by using the machine learning algorithm or mean a device which uses the trained artificial neural network. Here, the AI server 200 may be composed of a plurality of servers to perform distributed processing or may be defined as a 5G network. Here, the AI server 200 may be included as a component of the AI device 100, and may perform at least a portion of the AI processing together.

The AI server 200 may include a communication circuit 210, a memory 230, the learning processor 240, a processor 260, and the like. The communication unit 210 may transmit and receive data to and from an external device such as the AI device 100.

The memory 230 may store a model (or an artificial neural network 231) which is being trained or has been trained through the learning processor 240. The learning processor 240 may train the artificial neural network 231 by using the learning data. The learning model may be used with being mounted on the AI server 200 of the artificial neural network or with being mounted on the external device such as the AI device 100.

The learning model may be implemented in hardware, software, or by a combination of hardware and software. When the learning model is partially or wholly implemented in software, one or more instructions constituting the learning model may be stored in the memory 230. The processor 260 may infer a result value for a new input data by using the learning model and may generate responses or control commands based on the inferred result value.

Figure 3:
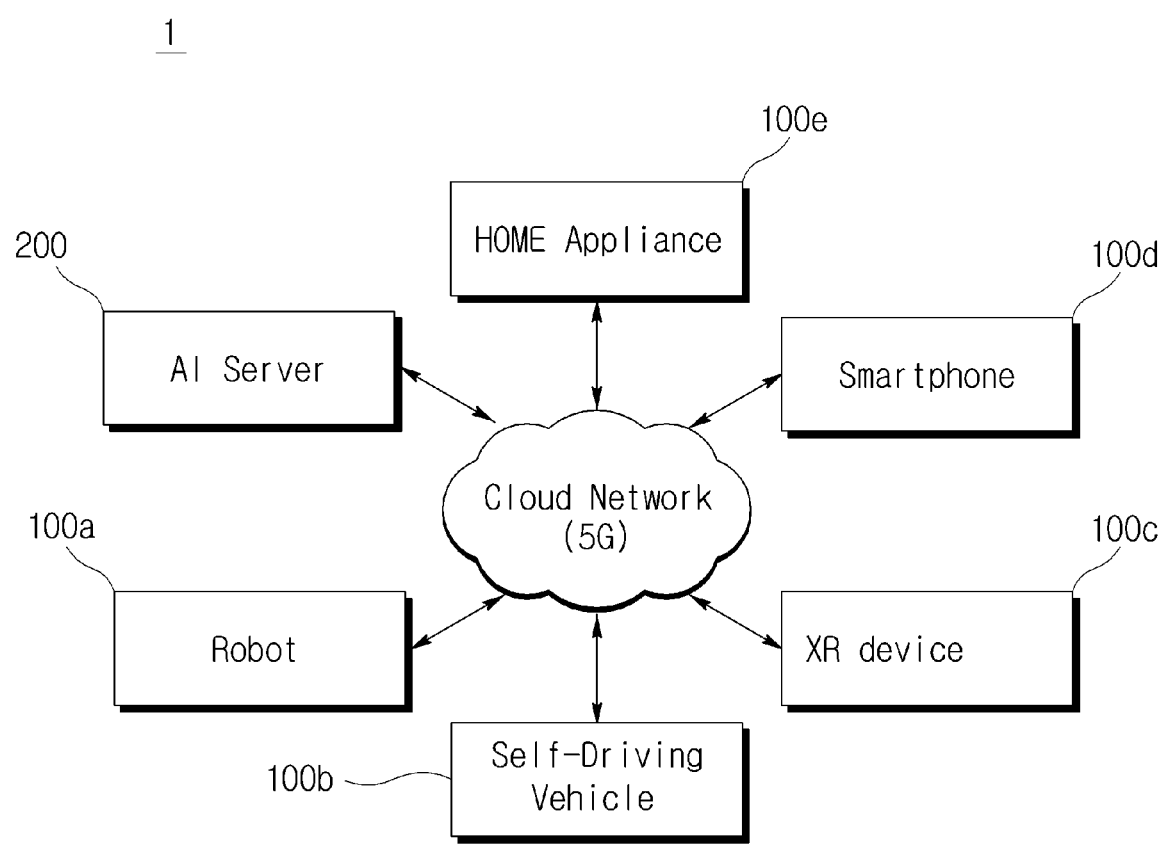
FIG. 3 shows an AI system according to the embodiment of the present invention.

FIG. 3 shows an AI system according to the embodiment of the present invention. Referring to FIG. 3, in the AI system 1, one or more of the AI server 200, a robot 100a, an autonomous vehicle 100b, an XR device 100c, a smartphone 100d, or a home appliance 100e are connected to a cloud network 10. Here, the robot 100a, the autonomous vehicle 100b, the XR device 100c, the smartphone 100d, or the home appliance 100e, to which an AI technology is applied, may be referred to as AI devices 100a to 100e.

The cloud network 10 may mean a network which forms a part of a cloud computing infrastructure or exists within the cloud computing infrastructure. Here, the cloud network 10 may be configured with a 3G network, a 4G or long-term evolution (LTE) network, or a 5G network, etc. That is, the respective devices 100a to 100e and 200 constituting the AI system 1 may be connected to each other through the cloud network 10. The respective devices 100a to 100e and 200 can communicate with each other through base stations, and also, they can communicate directly with each other without base stations.

The AI server 200 may include a server which performs artificial intelligence processing and a server which performs operations on big data. The AI server 200 may be connected through the cloud network 10 to at least one of the robot 100a, the autonomous vehicle 100b, the XR device 100c, the smartphone 100d, or the home appliance 100e which are AI devices that constitute the AI system 1. The AI server 200 may support at least a portion of the artificial intelligence processing of the connected AI devices 100a to 100e.

Here, the AI server 200 in lieu of the AI devices 100a to 100e may train the artificial neural network in accordance with the machine learning algorithm and may directly store the learning model or transmit to the AI devices 100a to 100e. Here, the AI server 200 may receive input data from the AI devices 100a to 100e, may infer a result value for the received input data by using the learning model, may generate a response or a control command based on the inferred result value, and may transmit the response or the control command to the AI devices 100a to 100e. Alternatively, the AI devices 100a to 100e may infer the result value for the input data by directly using the learning model, and may generate a response or a control command based on the inference result value.

Hereinafter, various embodiments of the AI devices 100a to 100e to which the above-described technology is applied will be described. The AI devices 100a to 100e shown in FIG. 3 may be regarded as a specific embodiment of the AI device 100 shown in FIG. 1. The AI technology is applied to the robot 100a and the robot 100a may be implemented as a guide robot, a transport robot, a cleaning robot, a wearable robot, an entertainment robot, a pet robot, an unmanned flying robot, or the like. The robot 100a may include a robot control module for controlling its operations, and the robot control module may mean a software module or may mean a chip obtained by implementing the software module by hardware.

The robot 100a uses sensor information obtained from various kinds of sensors, thereby obtaining the state information of the robot 100a, detecting (recognizing) ambient environment and objects, generating map data, determining a travel path and a driving plan, determining a response to user interaction, or determining the operation. Here, in order to determine the travel path and the driving plan, the robot 100a may use the sensor information obtained from at least one sensor among a lidar, a radar, and a camera.

The robot 100a may perform the above operations by using the learning model composed of at least one artificial neural network. For example, the robot 100a may recognize ambient environment and objects by using the learning model and may determine the operation by using information on the recognized ambient environment or the recognized object. Here, the learning model may be trained directly by the robot 100a or may be trained by external devices such as the AI server 200, etc. Here, the robot 100a may perform the operation by producing a result through the direct use of the learning model and may also perform the operation by transmitting the sensor information to external devices such as the AI server 200, etc., and by receiving the result produced accordingly.

The robot 100a may use at least one of the map data, the object information detected from the sensor information, or the object information obtained from the external device to determine the travel path and the driving plan, and may be made to travel along the determined travel path and driving plan by controlling a driving unit. The map data may include object identification information on various objects disposed in a space where the robot 100a moves. For example, the map data may include the object identification information on fixed objects such as a wall, a door, etc., and movable objects such as a flowerpot, a desk, etc. Also, the object identification information may include names, types, distances, locations, etc.

Also, the robot 100a may perform the operation or travel by controlling the driving unit on the basis of the control/interaction of the user. Here, the robot 100a may obtain intent information of the interaction according to the action or voice utterance of the user and may determine a response based on the obtained intent information and perform the operation.

The AI technology is applied to the autonomous vehicle 100b, and the autonomous vehicle 100b may be implemented as a mobile robot, a vehicle, an unmanned flying vehicle, or the like. The autonomous vehicle 100b may include an autonomous driving control module for controlling an autonomous driving function, and the autonomous driving control module may mean a software module or a chip obtained by implementing the software module by hardware. The autonomous driving control module may be included in the autonomous vehicle 100b as a component thereof, or may be connected to the autonomous vehicle 100b as a separate external hardware.

The autonomous vehicle 100b uses sensor information obtained from various kinds of sensors, thereby obtaining the state information of the autonomous vehicle 100b, detecting (recognizing) ambient environment and objects, generating map data, determining a travel path and a driving plan, or determining the operation. Here, in order to determine the travel path and the driving plan, the autonomous vehicle 100b, as with the robot 100a, may use the sensor information obtained from at least one sensor among the lidar, the radar, and the camera. In particular, the autonomous vehicle 100b b may recognize environment or objects of an area where a view is blocked or an area spaced apart by a distance larger than a certain distance, by receiving the sensor information from s, or may receive the information directly recognized by external devices.

The autonomous vehicle 100b may perform the above operations by using the learning model composed of at least one artificial neural network. For example, the autonomous vehicle 100b may recognize ambient environment and objects by using the learning model and may determine a driving line by using information on the recognized ambient environment or the recognized object. Here, the learning model may be trained directly by the autonomous vehicle 100b or may be trained by external devices such as the AI server 200, etc.

Here, the autonomous vehicle 100b may perform the operation by producing a result through the direct use of the learning model and may also perform the operation by transmitting the sensor information to external devices such as the AI server 200, etc., and by receiving the result produced accordingly. The autonomous vehicle 100b may use at least one of the map data, the object information detected from the sensor information, or the object information obtained from the external device to determine the travel path and the driving plan, and may be made to travel along the determined travel path and driving plan by controlling a driving unit.

The map data may include object identification information on various objects disposed in a space (e.g., a road) where the autonomous vehicle 100b travels. For example, the map data may include the object identification information on fixed objects such as a street light, rock, buildings, etc., and movable objects such as vehicles, pedestrians, etc. Also, the object identification information may include names, types, distances, locations, etc.

Also, the autonomous vehicle 100b may perform the operation or travel by controlling the driving unit on the basis of the control/interaction of the user. Here, the autonomous vehicle 100b may obtain intent information of the interaction according to the action or voice utterance of the user and may determine a response based on the obtained intent information and perform the operation.

The AI technology is applied to the XR device 100c and the XR device 100c may be implemented as a head-mount display (HMD), a head-up display (HUD) provided in the vehicle, a television, a mobile phone, a smartphone, a computer, a wearable device, a home appliance, a digital signage, a vehicle, a stationary robot, a mobile robot, or the like. The XR device 100c may analyze three-dimensional point cloud data or image data obtained from various sensors or the external devices, and may generate position data and attribute data for the three-dimensional points, thereby obtaining information on the surrounding space or the real object, and rendering and outputting an XR object to be output. For example, the XR device 100c may cause the XR object including additional information on the recognized object to be output in correspondence to the recognized object.

The XR device 100c may perform the above-described operations by using the learning model composed of at least one artificial neural network. For example, the XR device 100c may recognize the real object from the three-dimensional point cloud data or the image data by using the learning model, and may provide information corresponding to the recognized real object. Here, the learning model may be directly trained by the XR device 100c, or may be trained by the external device such as the AI server 200. Here, the XR device 100c may perform the operation by producing a result through the direct use of the learning model and may also perform the operation by transmitting the sensor information to external devices such as the AI server 200, etc., and by receiving the result produced accordingly.

The AI technology and an autonomous driving technology are applied to the robot 100a, and the robot 100a may be implemented as a guide robot, a transport robot, a cleaning robot, a wearable robot, an entertainment robot, a pet robot, an unmanned flying robot, or the like. The robot 100a to which the AI technology and the autonomous driving technology are applied may refer to a robot itself having the autonomous driving function or the robot 100a interacting with the autonomous vehicle 100b. The robot 100a having the autonomous driving function may be collectively referred to as a device that moves for itself along a given route even without user control or moves by determining the route by itself.

The robot 100a having the autonomous driving function and the autonomous vehicle 100b may use a common sensing method so as to determine at least one of the travel path and the driving plan. For example, the robot 100a having the autonomous driving function and the autonomous vehicle 100b may determine at least one of the travel path and the driving plan by using the information sensed through the lidar, the radar, and the camera.

The robot 100a that interacts with the autonomous vehicle 100b exists separately from the autonomous vehicle 100b. Inside or outside the autonomous vehicle 100b, the robot 100a may perform operations associated with the autonomous driving function of the autonomous vehicle 100b or associated with the user who has ridden on the autonomous vehicle 100b. Here, the robot 100a that interacts with the autonomous vehicle 100b may control or assist the autonomous driving function of the autonomous vehicle 100b by obtaining the sensor information on behalf of the autonomous vehicle 100b and providing the sensor information to the autonomous vehicle 100b, or by obtaining the sensor information, generating the ambient environment information or the object information, and providing the information to the autonomous vehicle 100b.

Alternatively, the robot 100a that interacts with the autonomous vehicle 100b may monitor the user who has ridden on the autonomous vehicle 100b, or may control the function of the autonomous vehicle 100b through the interaction with the user. For example, when it is determined that the driver is in a drowsy state, the robot 100a may activate the autonomous driving function of the autonomous vehicle 100b or assist the control of the driving unit of the autonomous vehicle 100b. Here, the function of the autonomous vehicle 100b controlled by the robot 100a may include not only the autonomous driving function but also the function provided by a navigation system or an audio system provided within the autonomous vehicle 100b.

Alternatively, outside the autonomous vehicle 100b, the robot 100a that interacts with the autonomous vehicle 100b may provide information to the autonomous vehicle 100b or assist the function of the autonomous vehicle 100b. For example, the robot 100a may provide the autonomous vehicle 100b with traffic information including signal information and the like such as a smart traffic light, and may automatically connect an electric charger to a charging port by interacting with the autonomous vehicle 100b like an automatic electric charger of an electric vehicle.

The AI technology and the XR technology are applied the robot 100a, and the robot 100a may be implemented as a guide robot, a transport robot, a cleaning robot, a wearable robot, an entertainment robot, a pet robot, an unmanned flying robot, a drone, or the like. The robot 100a to which the XR technology is applied may refer to a robot that is subjected to control/interaction in an XR image. In this case, the robot 100a may be separated from the XR device 100c and interwork with each other.

When the robot 100a which is subjected to control/interaction in the XR image obtains the sensor information from the sensors including a camera, the robot 100a or the XR device 100c may generate the XR image based on the sensor information, and the XR device 100c may output the generated XR image. The robot 100a may operate based on the control signal input through the XR device 100c or based on the user interaction. For example, the user may check the XR image corresponding to a view of the robot 100a interworking remotely through the external device such as the XR device 100c, may control the autonomous driving path of the robot 100a through the interaction, may control the operation or driving, or may check information on the surrounding objects.

The AI technology and the XR technology are applied the autonomous vehicle 100b, and the autonomous vehicle 100b may be implemented as a mobile robot, a vehicle, an unmanned flying vehicle, or the like. The autonomous vehicle 100b to which the XR technology is applied, may refer to an autonomous vehicle equipped with a means for providing an XR image or an autonomous vehicle that is subjected to control/interaction in an XR image. Particularly, the autonomous vehicle 100b that is subjected to control/interaction in an XR image may be separated from the XR device 100c and interwork with each other.

The autonomous vehicle 100b equipped with the means for providing an XR image may obtain the sensor information from the sensors including a camera and may output the XR image generated based on the obtained sensor information. For example, the autonomous vehicle 100b may include a HUD to output an XR image, thereby providing a passenger with an XR object corresponding to a real object or an object in the screen.

Here, when the XR object is output to the HUD, at least a part of the XR object may be output so as to overlap an actual object to which the passenger's gaze is directed. Meanwhile, when the XR object is output to the display provided within the autonomous vehicle 100b, at least a part of the XR object may be output so as to overlap the object in the screen. For example, the autonomous vehicle 100b may output XR objects corresponding to objects such as a lane, another vehicle, a traffic light, a traffic sign, a two-wheeled vehicle, a pedestrian, a building, and the like.

When the autonomous vehicle 100b that is subjected to control/interaction in the XR image obtains the sensor information from the sensors including a camera, the autonomous vehicle 100b or the XR device 100c may generate the XR image based on the sensor information, and the XR device 100c may output the generated XR image. The autonomous vehicle 100b may operate based on the control signal input through the external device such as the XR device 100c or based on the user interaction.

Hereinafter, various embodiments of a control method of the robot 100a will be described as an example of the AI device 100. However, the following embodiments are not limited to be applicable only to the robot 100a, and may be applied to other AI devices 100b to 100e within a range in which the spirit is not changed. For example, the following embodiments may be applied to the autonomous vehicle 100b, the XR device 100c, etc., implemented as a mobile robot or the like.

Figure 4:
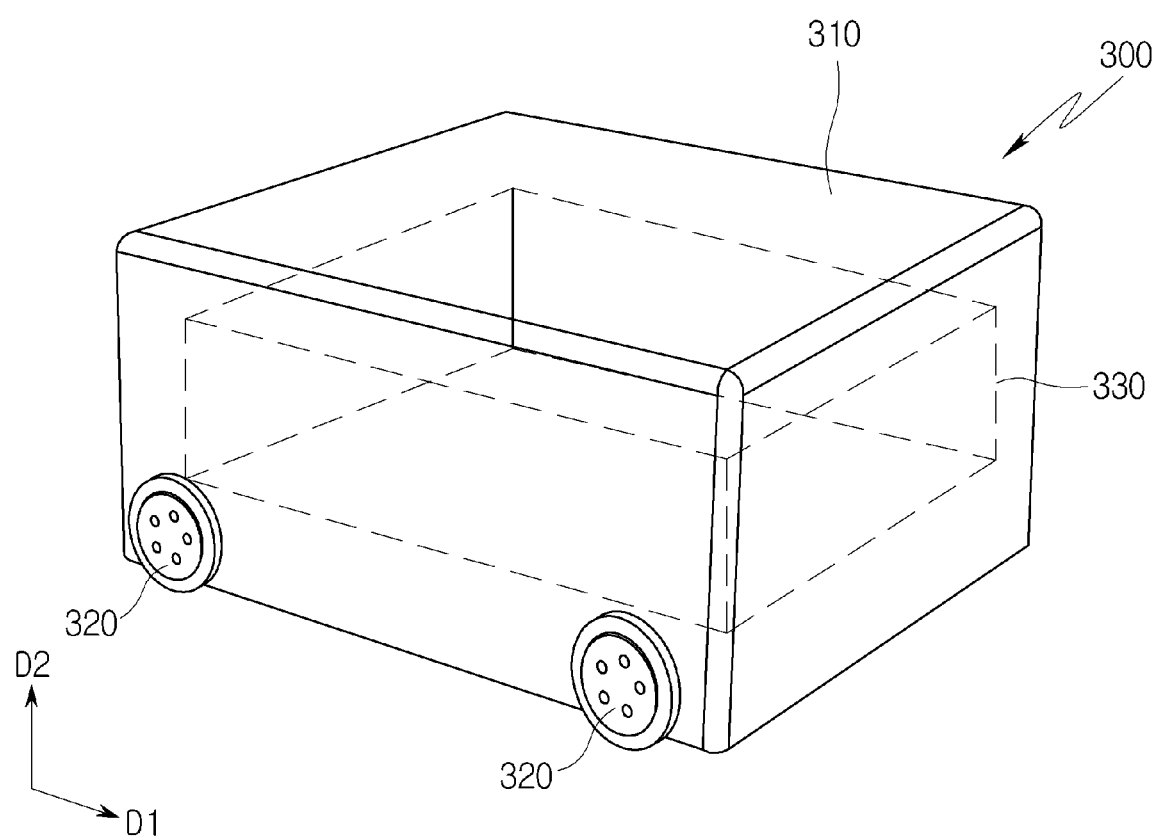
FIG. 4 is a perspective view of a robot according to the embodiment of the present invention.
Figure 5:
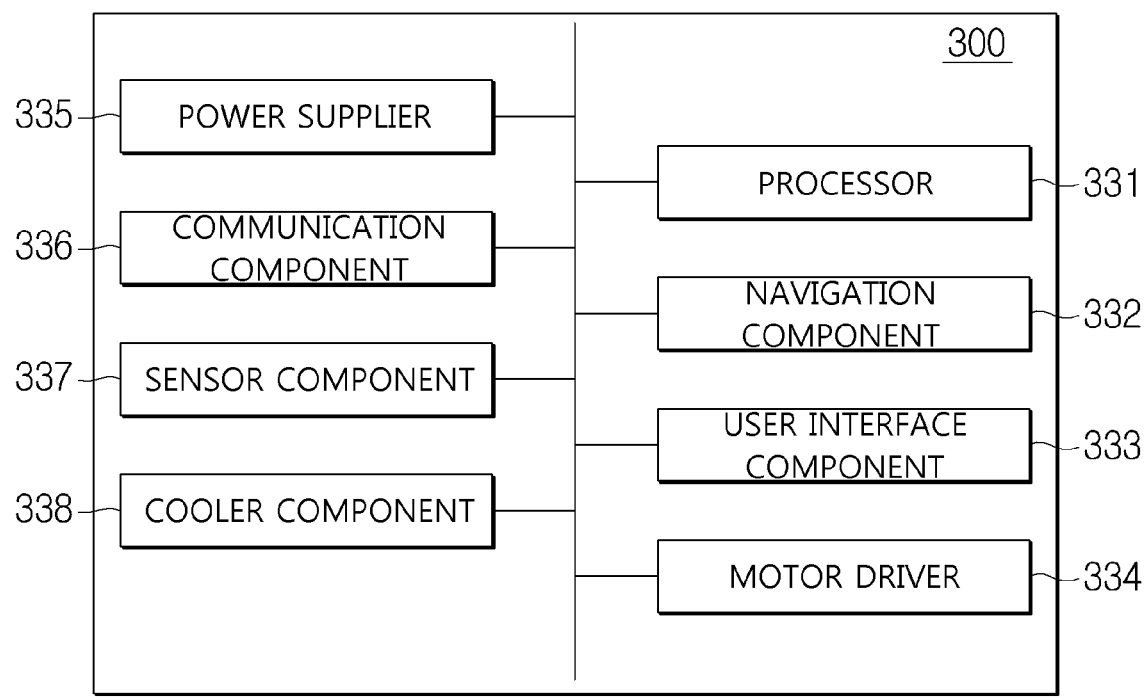
FIG. 5 is a block diagram showing the configuration of a robot control device according to the embodiment of the present invention.

FIG. 4 is a perspective view of the robot according to the embodiment of the present invention, and FIG. 5 is a block diagram showing the configuration of the robot according to the embodiment of the present invention. The robot 300 is the AI device 100 described with reference to FIGS. 1 to 3, and may be, for example, the robot 100a shown in FIG. 3. In description of the embodiments of FIGS. 4 and 5, repetitive descriptions of components the same as or similar to those shown in FIGS. 1 to 3 will be omitted.

Referring to FIG. 4, the robot 300 may include a body 310 and at least one moving part coupled to the body 310. The movable part may include, for example, a drive wheel 320. The robot 300 may be a mobile robot capable of moving in an autonomous driving method and/or in a following driving method through the drive wheel 320. The drive wheel 320 may be driven by using a motor (not shown). While FIG. 4 shows that the robot 300 includes four drive wheels 320, the embodiment of the present disclosure is not limited thereto. That is, the robot 300 may be provided with two or more drive wheels 320, and, for example, may be driven by a front wheel or a rear wheel when the robot 300 includes four or more drive wheels 320.

Although not shown, the robot 300 may also include at least one robot arm or the like as the movable part. The robot arm may include at least one joint whose movement is controlled by a motor or an actuator. The robot may perform various requested actions by moving the robot arm through joint control.

A robot control device 330 may be provided within the body 310. In various embodiments, the robot control device 330 may include components (parts) for controlling the movement of the movable part. The components included in the robot control device 330 may be mounted in the form of a package in a case, and the case may be installed within the body 310 of the robot 300.

Referring to FIG. 5, the robot control device 330 includes a processor (or processor board) 331, a navigation component (or navigation board) 332, a user interface component (or user interface board) 333, a motor driver (or motor driver board) 334, a power supplier (or power supply board) 335, a include (or communications board) 336, a sensor component (or sensor board) 337, and a cooler component (or fan) 338. The processor 331 may control the overall operation of the robot 300. The processor 331 may control other components provided in the robot 300. That is, the processor 331 may process data received from the components, generate a control signal corresponding thereto, and transmit the control signal to the components. The processor 331 may be a micro controller unit (MCU) in which logic circuit blocks performing various functions and memories such as RAM, ROM, etc., are integrally formed. The processor 331 may be substantially the same as the processor 180 shown in FIG. 1.

The navigation component 332 may manage the movement of the robot 300. The navigation component 332 may control the drive wheel 320 such that the robot 300 can move along a moving path determined by the processor 331, etc.

The user interface component 333 may receive input from the user, convert it into data in the form that the processor 331 can process, and transfer it to the processor 331. The user interface component 133 may receive a signal generated from the input device 120 shown in FIG. 1, and sense a user input through the signal. The input device 120 may include a camera, a microphone, a touch panel, a button, a switch, a keypad, a jog dial, a jog switch, and the like.

In various other embodiments, the user input may be received from external devices (e.g., a server, an administrator terminal, etc.) through a communication circuit (e.g., the communication circuit 110 shown in FIG. 1). In the embodiment, when the robot 300 is implemented by a communication input method that receives the user input only from external devices, the user interface component 333 may be omitted.

The motor driver 334 may drive at least one motor provided in the robot 300. In the embodiment, the motor driver 334 may convert a control command received from the processor 331 into an electrical signal such as a pulse width modulation (PWM) signal, and output the electrical signal to the motors. When the motor is driven according to the electrical signal, movement is provided to the moving part coupled to the corresponding motor.

The power supplier 335 distributes and supplies power supplied from the outside of the robot 300 to the components. The power supplier 335 may include at least one battery that is charged by externally supplied power and discharged by supplying power to the components. In various embodiments, the power supplier 335 may monitor the states of the external power supply and the battery, etc., and may transmit information on the states to the processor 331.

The communication component 336 may transmit various signals generated within the robot control device 330 to other components within the robot control device 330 or outside the robot control device 330. For example, the communication component 336 may transmit signals generated within the robot control device 330 to the components within the robot 300 through a digital input/output module and an analog input/output module which support Ethernet communication.

The sensor component 337 may include at least one sensor for collecting state information of the robot 300 and information on ambient environment of the robot 300, etc. The sensor may be a proximity sensor, an illuminance sensor, an acceleration sensor, a magnetic sensor, a gyro sensor, an inertial sensor, an RGB sensor, an IR sensor, a fingerprint sensor, an ultrasonic sensor, an optical sensor, a microphone, a lidar, and a radar, etc.

The cooler component 338 may include at least one fan for cooling heat generated by the robot control device 330. The on/off, the rotation speed, etc., of the fan may be controlled based on the control command transmitted through the processor 331, the power supplier 335 or the like. The processor 331 and the like may measure a temperature inside the robot control device 330 through the sensor component 337 and may control the operation of the cooler component 338 in accordance with the measured temperature.

The components of the robot control device 330 may be electrically connected. In the embodiment, the components may be connected to each other through a connector board to be described later. The connector board may be formed of a printed circuit board (PCB) in which a plurality of connectors are fixed thereon and copper wires connecting the connectors are printed. Each connector may include at least one hole in which an electrical terminal is formed. The components may include a connector composed of at least one pin. By fastening the hole of the connector board and the pin of the component, the component is physically fixed to the connector board, and the connector board and the component can be electrically connected.

The components may be electrically connected via wirings printed on the connector board. For example, the power supplier 335 may be electrically connected to other components through the wirings printed on the connector board and may supply power to other components.

The components may be connected to each other through a cable provided separately from the connector board. The connector that includes at least one hole is included on both ends of the cable, so that the components can be coupled to different components. The closer the distance between the components to be connected through the cable, the shorter the length of the cable. Also, the shorter the length of the cable, the more improved the internal ventilation and cooling efficiency of the robot control device 330 and the less the complexity.

As shown in FIG. 4, the lower a center of gravity of the moving robot 300, the more the stability is ensured. In order to lower the center of gravity, the height of the body 310 must be reduced. As described above, the robot 300 is provided with various components, and in order to mount these components, the height of the body 310 is limited to a certain value or more. In addition, when components are densely disposed to minimize the height, the cooling efficiency may be degraded, and noise may be generated in the data by interference between components, so that the robot 300 may not be properly controlled.

In the present embodiments, components may be arranged in two columns, thereby reducing the height of the body 310 instead of increasing the width of the body 310. In addition, in the present embodiments, components having high heat generation (for example, the power supplier 335, the motor driver 334, etc.) may be disposed in a position where cooling can be well performed. Component where mutual interference blocking is important (for example, the processor 331, the navigation component 332, etc.) may be disposed far from the component with high noise generation. By efficiently arranging the components as described above, the control accuracy of the robot 300 can be improved in the embodiments.

For the above arrangement of the components, the connectors provided on the connector board are arranged at a specific position of the connector board in accordance with the type of component to be coupled. Hereinafter, a more specific configuration of the robot control device 330 including the connector board will be described.

Figure 6:
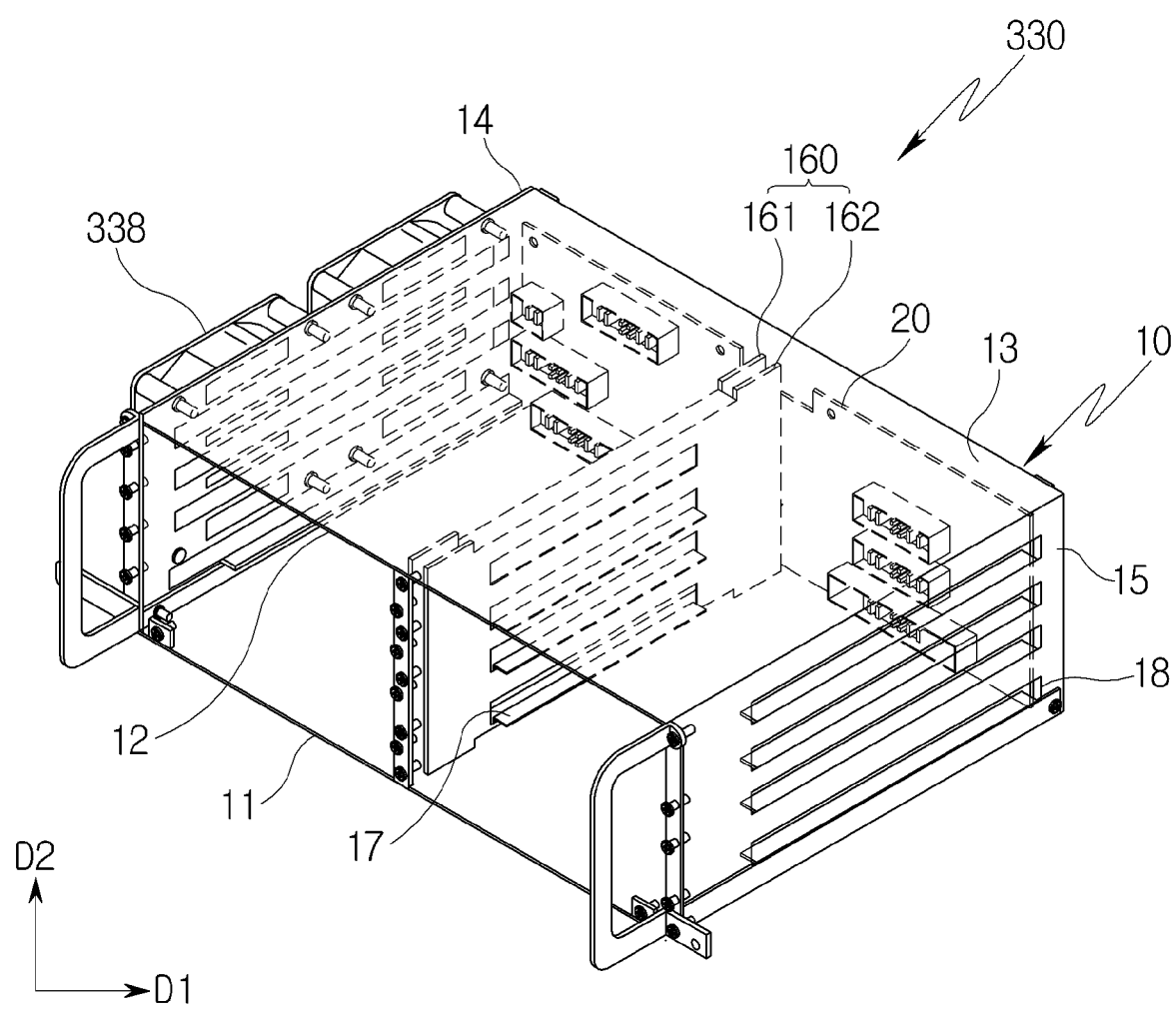
FIG. 6 is a perspective view of the robot control device in a state where components are not combined.
Figure 7:
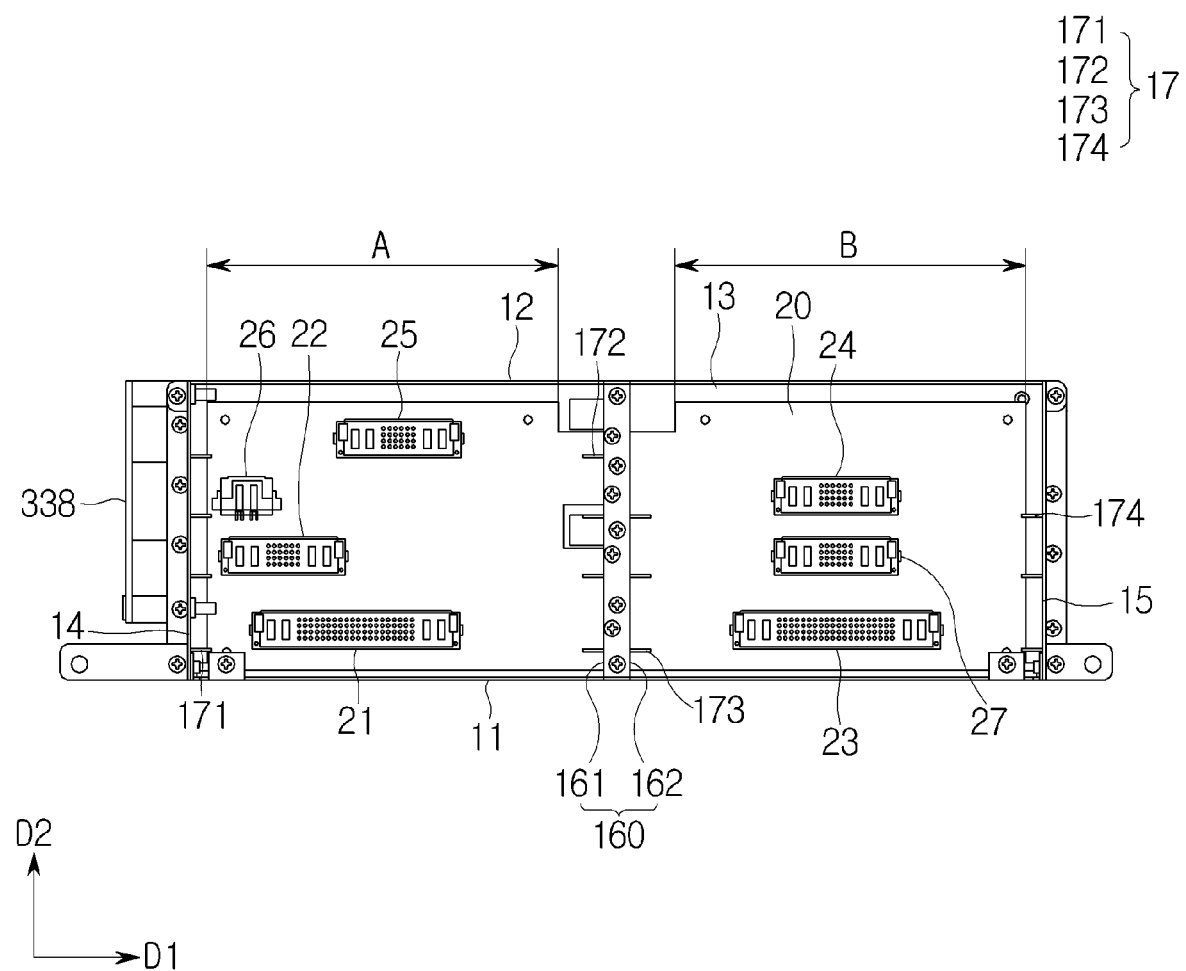
FIG. 7 is a front view of the robot control device shown in FIG. 6.
Figure 8:
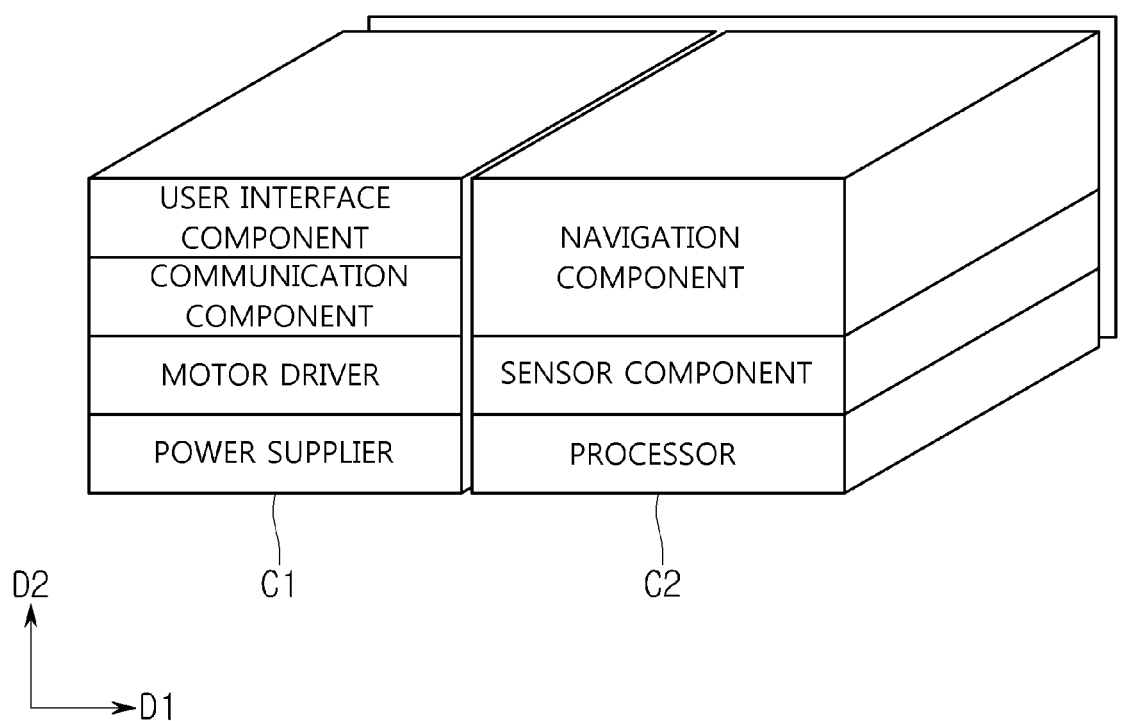
FIG. 8 is a perspective view showing schematically a state where the components have been coupled to a connector board.
Figure 9:
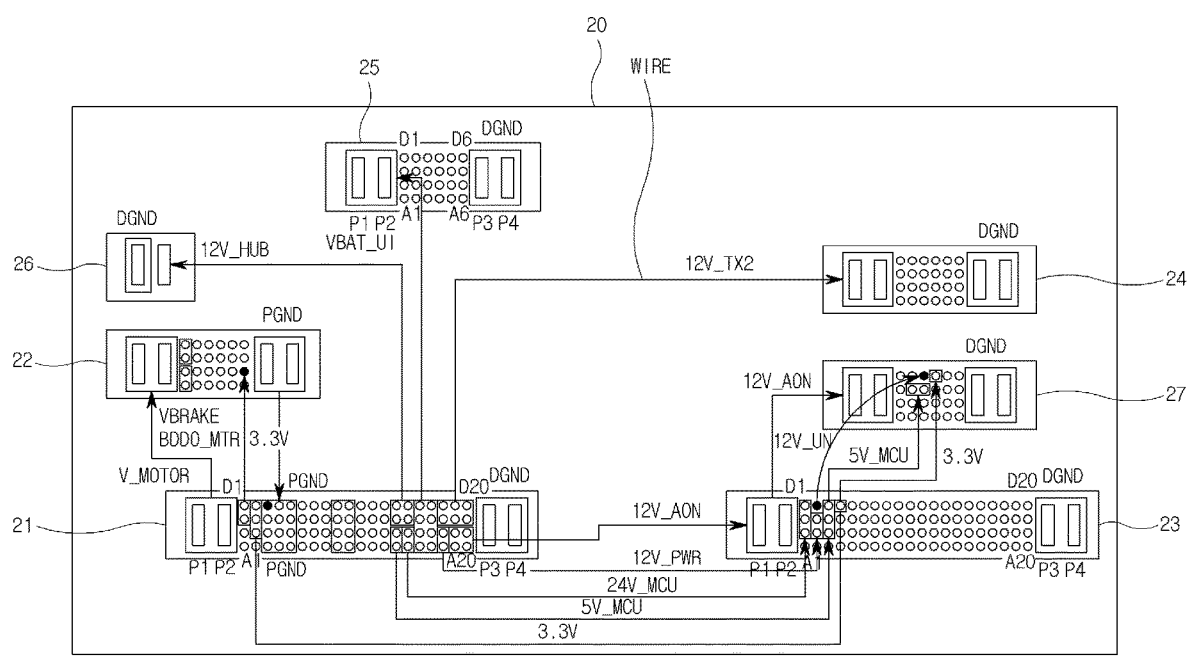
FIG. 9 is a view showing schematically an electrical connection relationship between a power connector and other connectors.
Figure 10:
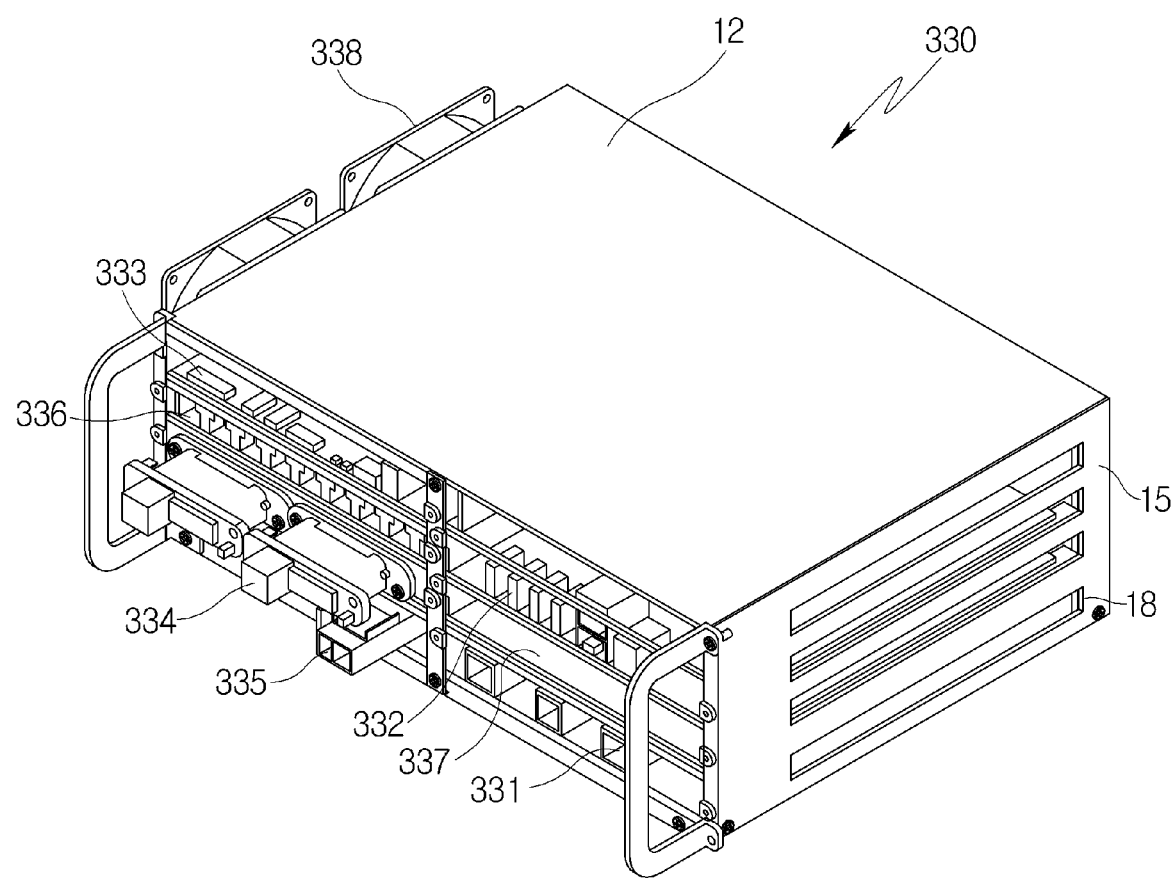
FIG. 10 is a perspective view of the robot control device in a state where the components have been combined.

FIG. 6 is a perspective view of the robot control device in a state where components are not combined. FIG. 7 is a front view of the robot control device shown in FIG. 6. FIG. 8 is a perspective view showing schematically a state where the components have been coupled to the connector board. FIG. 9 is a view showing schematically an electrical connection relationship between a power connector and other connectors. FIG. 10 is a perspective view of the robot control device in a state where the components have been combined.

First, referring to FIGS. 6 and 7, the robot control device 330 according to the embodiment may include a case (or chassis) 10 and components received within the case 10. The case 10 has a substantially rectangular parallelepiped shape. The case 10 includes a lower wall 11, an upper wall 12 disposed apart from the lower wall 1 in a first direction D1, and a plurality of sidewalls 13, 14, and 15 connecting the lower wall 11 and the upper wall 12. At least three sidewalls 13, 14, and 15 are provided to surround three side surfaces of the case 10. For example, the sidewalls 13, 14, and 15 may include the first sidewall 13 disposed on the rear side of the case 10 in the drawing, and the second sidewall 14 and the third sidewall 15 which are perpendicular to the first sidewall 13 and are spaced apart from each other. The lower wall 11, the upper wall 12, and the sidewalls 13, 14 and 15 may be integrally manufactured. Alternatively, the lower wall 11, the upper wall 12, and the sidewalls 13, 14, and 15 may be individually manufactured and be attached to each other by an adhesive, or may be physically fastened through a fastening member such as a hinge, bolt/nut, or the like.

In various embodiments, at least one opening 18 may be formed in at least some of the sidewalls 13, 14, and 15. In the shown embodiment, a plurality of the openings 18 are formed in the second sidewall 14 and in the third sidewall 15. The opening 18 may be formed to have a polygonal shape such as a rectangle, a circular shape, an elliptical shape, or the like. The openings 18 may be formed in most areas of the second sidewall 14 and the third sidewall 15. Through these openings 18, ventilation of the robot control device 330 can be secured, and heat within the robot control device 330 can be easily discharged to the outside.

The cooler component 338 may be disposed outside of at least one of the second sidewall 14 and the third sidewall 15. The cooler component 338 overlaps with at least one area of the opening 18 formed in the second sidewall 14 and/or the third sidewall 15. As the fan provided in the cooler component 338 rotates, the cooler component 338 can quickly suck air inside the case 10, and the sucked air can be forcibly discharged through the cooler component 338.

A plurality of components (or boards) may be disposed within the case 10. The components include, for example, the processor 331, the navigation component 332, the user interface component 333, the motor driver 334, the power supplier 335, the communication component 336, and the sensor component 337. The components within the case 10 may be arranged according to a certain rule. An embodiment of a rule in which the components are arranged will be described with reference to FIG. 8.

In various embodiments, the components are disposed in a first column C1 and in a second column C2 aligned along the first direction D1. In each of the columns C1 and C2, the components are stacked along a second direction D2. The number of components which are stacked in each of the columns C1 and C2 may be determined according to the size and number of all components constituting the robot control device 330. For example, let us suppose that the height of any component (for example, the navigation component 332 in FIG. 8) is greater than the height of other components. In this case, in the column in which the corresponding component is disposed (for example, in the second column C2 of FIG. 8), fewer components than that of other columns (for example, the first column C1 in FIG. 8) may be disposed.

As described in the embodiment, when the components are disposed in the plurality of columns C1 and C2, the height of the robot 300 on which the robot control device 330 is mounted may become relatively low, and when the robot 300 moves, the stability can be improved. Hereinafter, while an example in which the components are disposed in two columns C1 and C2 will be described, the components may be disposed in more than two columns in various embodiments.

In each column, the components may be arranged, for example, based on a heating value, an amount of operations, and whether or not a direct connection is made between the components. In the embodiment, among the components, components having a large heating value may be disposed close to the lower wall 11 of the case 10 and may be disposed adjacent to each other. Here, the components having a large heating value may include, for example, the power supplier 335 and the motor driver 334.

The lower wall 11 of the case 10 is generally disposed adjacent to the bottom surface when the robot control device 330 is mounted within the body 310 of the robot 300.

Therefore, heat emitted from the components disposed adjacent to the lower wall 11 can be easily discharged to the outside through the bottom surface of the body 310.

Accordingly, the components having a large heating value may be sequentially arranged from the bottom to the top of the robot control device 330. For example, the power supplier 335 may be disposed at the bottom of the first column C1, and the motor driver 334 may be disposed over and adjacent to the power supplier 335. However, the arrangement of the power supplier 335 and the motor driver 334 is not limited to what is shown, and various arrangement changes are possible as long as the components having a large heating value are disposed adjacent to the lower wall 11.

In the embodiment, among the components, components which have a large amount of operations and need to perform high-speed processing are arranged in a column different from that in which the components having a large heating value are arranged. These components may include, for example, the navigation component 332 and the processor 331.

In general, the components having a large heating value generate a lot of noise on adjacent components. This noise acts as an interference in the signal transmitted to the adjacent components, so that errors may be generated in the operations to be processed by the components. In addition, when heat is transferred from the components having a large heating value to these components, the component processing a large amount of operations at a high speed may generate heat above a threshold.

Therefore, these components are arranged in a column different from that in which the components having a large heating value are arranged. For example, the processor 331 and the navigation component 332 may be arranged in the second column C2. In particular, the navigation component 332 that needs to perform accurate real-time high-speed operation may be disposed at the top of the second column C2 farthest from the power supplier 335. However, the arrangement of the processor 331 and the navigation component 332 is not limited to what is shown, and various arrangement changes are possible as long as the components are disposed away from the components having a large heating value.

In the embodiment, the user interface component 333 may be disposed on the top of the components. That is, the user interface component 333 may be disposed adjacent to the upper wall 12. The input device 120 for sensing user input is generally disposed on the body 310 of the robot 300 for the convenience of user operation.

Since the user interface component 333 has to receive a signal from the input device 120, it is advantageous to arrange the user interface component 333 close to the input device 120 in terms of a transmission speed and noise. Accordingly, the user interface component 333 may be disposed at the top of the components in such a way as to be close to the input device 120. In this embodiment, the length of the cable connecting the user interface component 333 and the input device 120 may be minimized. In the shown embodiment, although the user interface component 333 is disposed in the first column C1, the embodiment of the present disclosure is not limited thereto, and the user interface component 333 is disposed at the top of the second column C2.

In the embodiment, the sensor component 337 may be disposed adjacent to the processor 331. Since the information collected by the sensor component 337 is used for robot control of the processor 331, the information must be transmitted to the processor 331 quickly and without interference. To this end, the sensor component 337 is directly connected to the processor 331 through a single cable. In order to minimize the length of the cable connecting the sensor component 337 and the processor 331, the sensor component 337 may be disposed above or below the processor 331.

In order to fixedly couple the components to the above arrangement, the case 10 further includes a separation wall 160 disposed between the first column C1 and the second column C2. At the boundary between the first column C1 and the second column C2, the separation wall 160 may be perpendicular to the first sidewall 13 and generally parallel to the second sidewall 14 and the third sidewall 15. In the embodiment, the separation wall 160 may be composed of two auxiliary walls 161 and 162 which are generally arranged in parallel.

In addition, similarly to the second sidewall 14 and the third sidewall 15, the separation wall 160 may include at least one opening 18. As the opening 18 is formed in the separation wall 160, ventilation between the components can be further improved.

The case 10 may further include a plurality of racks (or rack extensions) 17 arranged between the second sidewall 14 and the separation wall 160 and between the separation wall 160 and the third sidewall 15. The components can be placed in a designated position by being seated on the rack 17 in the corresponding position. That is, the components arranged in the first column C1 are seated in the racks 17 provided between the second sidewall 14 and the separation wall 160, and the components arranged in the second column C2 are seated in the racks 17 provided between the separation wall 160 and the third sidewall 15.

The racks 17 may be composed of two separate extensions 171, 172, 173, and 174. For example, the rack 17 may include a second sidewall extension 171 extending vertically from the second sidewall 14 toward the inside of the case 10 and a separation wall extension 172 extending vertically toward the second sidewall 14 from the separation wall 160. Here, the separation wall extension 172 may extend from the first auxiliary wall 161 disposed adjacent to the second sidewall 14. Further, for example, the rack 17 may include a separation wall extension 173 extending vertically from the separation wall 160 toward the third sidewall 15 and a third sidewall extension 174 extending vertically from the third sidewall 15 toward the inside of the case 10. Here, the separation wall extension 173 may extend from the second auxiliary wall 162 disposed adjacent to the third sidewall 15.

In the above-described embodiment, since an area where the components are shielded by the rack 17 is minimized, ventilation inside the case 10 is secured, and heat generated by the components can be easily discharged to the outside. However, the shape of the rack 17 is not limited to what is shown. In other embodiments, the rack 17 may be variously formed to have a flat plate shape, a shape in which a plurality of openings are formed on a flat plate, and the like. A distance between the racks 17 may be the same or different depending on the size of the components seated between the racks 17. FIG. 7 shows an exemplary distance between the racks 17. However, the distance between the racks 17 is not limited to what is shown.

In various embodiments, the components may be electrically connected through the connector board (or bus) 20. The connector board 20 may be coupled to the first sidewall 13 of the case 10. Here, for emitting the heat, the connector board 20 may be installed apart by a predetermined distance from the first sidewall 13. The connector board 20 is generally plate-shaped and is disposed parallel to the first sidewall 13.

Referring to FIG. 7, the connector board 20 has a first region A and a second region B which are disposed adjacent to each other in the first direction D1. The first region A may correspond to the first column C1 of the components, and the second region B may correspond to the second column C2 of the components.

A plurality of connectors (also referred to herein as plugs or sockets) 21 to 27 may be disposed in the first region A and the second region B. The connectors 21 to 27 are sequentially arranged in each of the first region A and the second region B in the second direction D2 substantially perpendicular to the first direction D1. The connectors 21 to 27 may be arranged one to one in correspondence with the respective racks 17.

In the embodiment, the connectors 21 to 27 may include a power connector 21 coupled with the power supplier 335, a motor driver connector 22 coupled with the motor driver 334, a processor connector 23 coupled with the processor 331, a navigation connector 24 coupled with the navigation component 332, a user interface connector 25 coupled with the user interface component 333, a communication connector 26 coupled with the communication component 336, and a sensor connector 27 coupled with the sensor component 337. However, the types of the connectors 21 to 27 are not limited to those described above, and various types of connectors may be provided on the connector board 20 in accordance with the types of the components provided in the robot control device 330.

The connectors 21 to 27 may have the same or different sizes. The connectors 21 to 27 may include at least one hole in which an electrical terminal is formed. The arrangement, shape, and size of the holes formed in the connectors 21 to 27 may be the same or different depending on the type of component coupled to the connectors 21 to 27. Here, the holes formed in one connector 21 to 27 may have the same or different shapes.

The connectors 21 to 27 each is coupled with a corresponding component. For this purpose, the components may include the connector composed of at least one pin. The pin provided in the connector of the component is inserted into the hole provided in the connectors 21 to 27 of the connector board 20, so that physical and electrical coupling is made between the connectors.

The positions of the connectors 21 to 27 on the connector board 20 are determined according to the arrangement of the corresponding component. In the embodiment, the power connector 21 coupled with the power supplier 335 may be disposed at the bottom of the first region A. In addition, the motor driver connector 22 coupled with the motor driver 334 may be disposed above the power supplier 335 in the first region A.

In the embodiment, the processor connector 23 coupled with the processor and the navigation connector 24 coupled with the navigation component 332 may be disposed in a region different from those of the power connector 21 and the motor driver connector 22, that is to say, in the second region B. Here, the navigation connector 24 may be disposed at the top of the second region B.

In the embodiment, the user interface connector 25 coupled with the user interface component 333 may be disposed on the top of the first region A or the second region B. In the shown embodiment, although the user interface connector 25 is disposed in the first region A, the embodiment of the present disclosure is not limited to this, and the user interface connector 25 may be arranged at the top of the second region B.

The sensor connector 27 coupled with the sensor component 337 may be disposed adjacent to the processor connector 23. For example, the sensor connector 27 may be disposed in the same area as the processor connector 23 and may be disposed above or below the processor connector 23.

FIG. 8 is a perspective view showing schematically a state where the components have been coupled to the connector board 20. As shown in FIG. 8, the components corresponding to the connectors 21 to 27 disposed at specific positions are combined and thus may be disposed at predetermined positions.

In various embodiments, the components may be electrically connected to each other through separate cables or the like. Alternatively, the components may be electrically connected through the connector board 20. In this embodiment, the connector board 20 may include wires connecting between the connectors 21 to 27, that is, between electrical terminals provided in the connectors 21 to 27. The wires may be printed on a board of the connector board 20. In the embodiment, the wires may electrically connect the power connector 21 and other connectors 22 to 27. The components connected to other connectors 22 to 27 may receive power output from the power supplier 335 connected to the power connector 21 through the wire.

Referring to FIG. 9, the power connector 21 includes a plurality of holes in which electrical terminals are provided. Some of the plurality of holes are connected to the electrical terminals of the motor driver connector 22, others of the plurality of holes are connected to the electrical terminals of the processor connector 23, and still others of the plurality of holes are connected to the electrical terminals of the navigation connector 24. Still others of the plurality of holes are connected to the electrical terminals of the user interface connector 25, still others of the plurality of holes are connected to the electrical terminals of the communication connector 26, and still others of the plurality of holes are connected to the electrical terminals of the sensor connector 27. The components connected to other connectors 22 to 27 through such a connection may receive power output from the power supplier 335 connected to the power connector 21.

In the shown embodiment, the front side of the case 10 is open to clearly show the internal components of the case 10. However, a fourth sidewall (not shown) or a cover, etc., which covers the front side of the case 10 may be provided on the front side of the case 10.

According to the above-described embodiments, FIG. 10 shows a specific form of the robot control device 330 in which the components have been combined. The forms of the components shown in FIG. 10 are only an example, and the specific form may be different depending on product models. Each component may be composed of a circuit board and parts mounted on the circuit board. If necessary, a cover case may be coupled to the front of the combined components, and at least one vent may be provided in the cover case.

Figure 11:
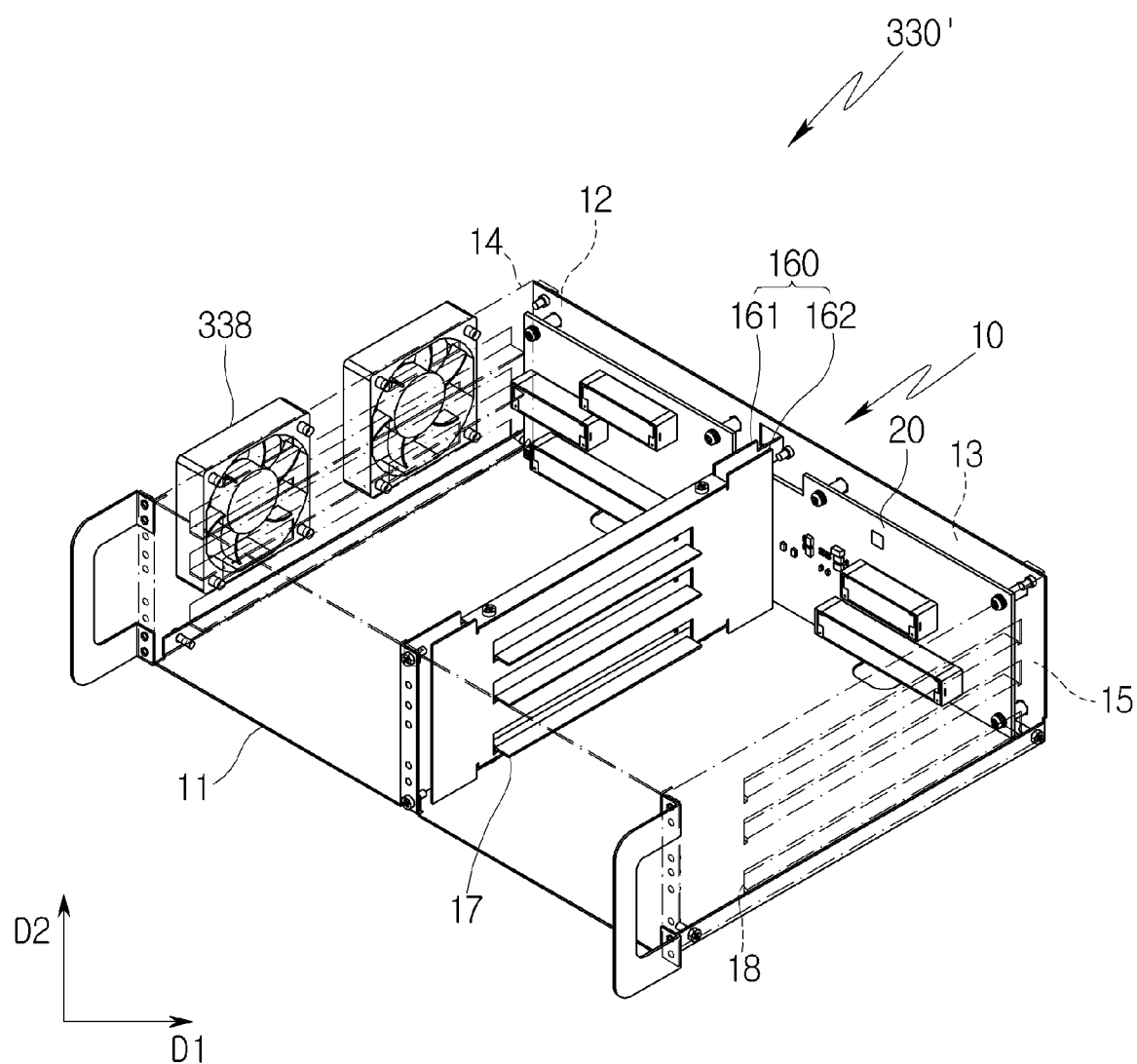
FIG. 11 is a perspective view of the robot control device according to another embodiment.
Figure 12:
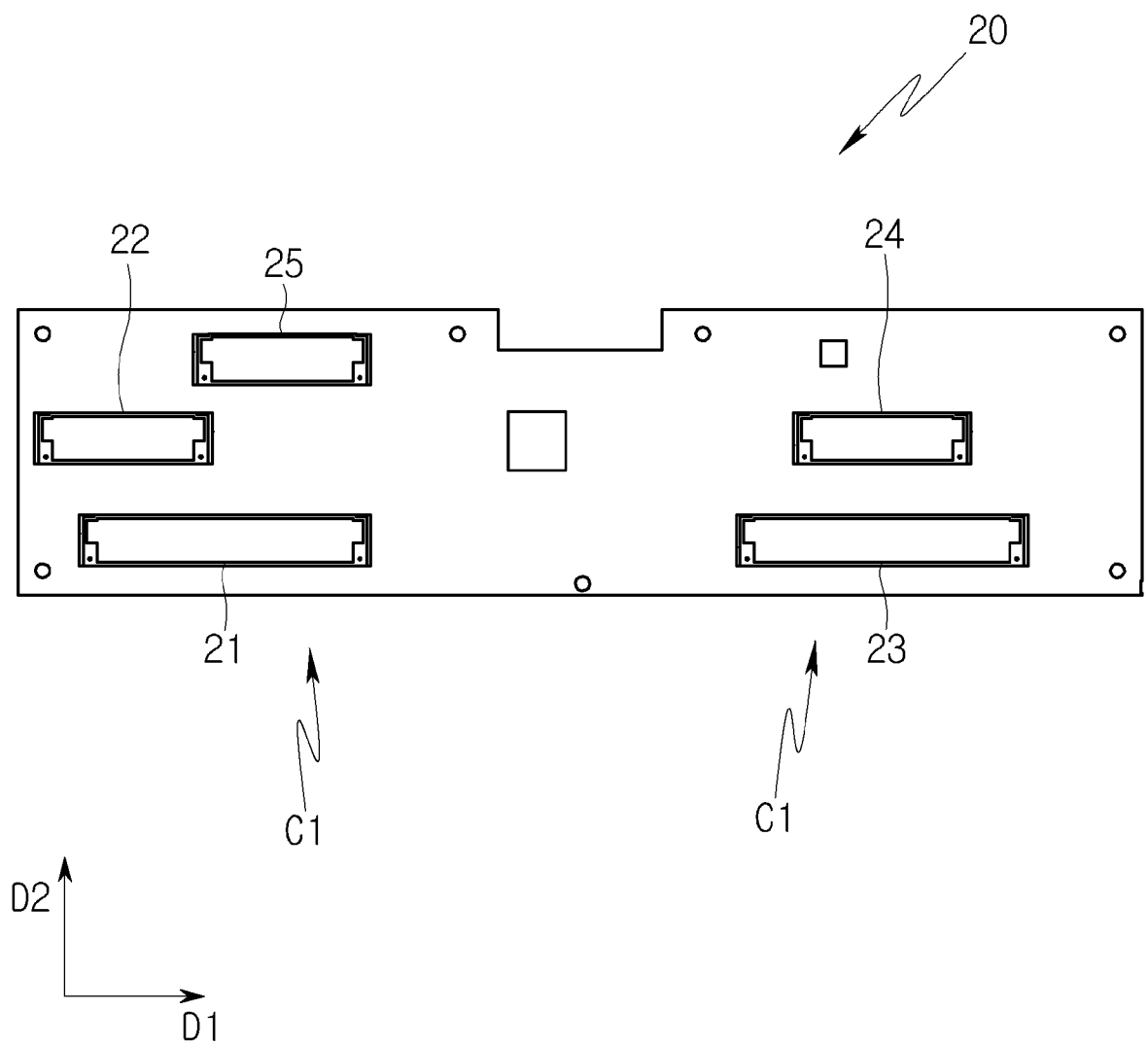
FIG. 12 is a front view of the connector board shown in FIG. 11.

FIG. 11 is a perspective view of the robot control device according to another embodiment. FIG. 12 is a front view of the connector board shown in FIG. 11. The embodiment shown in FIGS. 11 and 12 is substantially similar to the embodiment shown in FIGS. 6 and 7 except the fact that the number of the components disposed in each of the column C1 and C2 of the connector board 20' is less than that of the embodiments shown in FIGS. 6 and 7. Specifically, in FIGS. 6 and 7, four components are combined in the first column C1 of the connector board 20, and three components are combined in the second column C2. However, in FIGS. 11 and 12, three components are combined in the first column C1 of the board 20', and two components are combined in the second column C2. Compared to the connector board 20, parts not coupled to the connector board 20' are implemented in an embedded form or in a combined form on the connector board 20' or on a separately provided board and provide a corresponding function. In this embodiment, the height of the robot 300 on which the robot control device 330' is mounted may be less than that in the embodiments shown in FIGS. 6 and 7.

In the description of the embodiments shown in FIGS. 11 and 12, the same reference numerals are assigned to the same components as those shown in FIGS. 6 and 7, and the detailed descriptions thereof will be omitted. In the embodiments shown in FIGS. 11 and 12, a plurality of components may be disposed within the case 10. The components may include, for example, the processor 331, the navigation component 332, the user interface component 333, the motor driver 334, and the power supplier 335.

The components within the case 10 may be arranged according to a certain rule. For example, the components are disposed in the first column C1 and in the second column C2 aligned along the first direction D1. In each of the columns C1 and C2, the components are stacked along the second direction D2.

In the embodiment, among the components, components having a large heating value may be disposed close to the lower wall 11 of the case 10 and may be disposed adjacent to each other. Here, the components having a large heating value may include, for example, the power supplier 335 and the motor driver 334. For example, the power supplier 335 may be disposed at the bottom of the first column C1, and the motor driver 334 may be disposed over and adjacent to the power supplier 335.

In the embodiment, among the components, components which have a large amount of operations and need to perform high-speed processing are arranged in a column different from that in which the components having a large heating value are arranged. These components may include, for example, the navigation component 332 and the processor 331. For example, the processor 331 and the navigation component 332 may be disposed in the second column C2.

In the embodiment, the user interface component 333 may be disposed on the top of the components. That is, the user interface component 333 may be disposed adjacent to the upper wall 12. In the shown embodiment, the user interface component 333 is disposed at the top of the first column C1. In various embodiments, the components may be electrically connected through the connector board 20. The connector board 20 may be coupled to the first sidewall 13 of the case 10. Here, for emitting the heat, the connector board 20 may be installed apart by a predetermined distance from the first sidewall 13. The connector board 20 is generally plate-shaped and is disposed parallel to the first sidewall 13.

Referring to FIG. 12, the connector board 20' has the first region A and the second region B which are disposed adjacent to each other in the first direction D1. The first region A may correspond to the first column C1 of the components, and the second region B may correspond to the second column C2 of the components.

A plurality of connectors 21 to 25 may be disposed in the first region A and the second region B. The connectors 21 to 25 are sequentially arranged in each of the first region A and the second region B in the second direction D2 substantially perpendicular to the first direction D1. The connectors 21 to 25 may be arranged one to one in correspondence with the respective racks 17.

In the embodiment, the connectors 21 to 25 may include the power connector 21 coupled with the power supplier 335, the motor driver connector 22 coupled with the motor driver 334, the processor connector 23 coupled with the processor 331, the navigation connector 24 coupled with the navigation component 332, and the user interface connector 25 coupled with the user interface component 333. However, the types of the connectors 21 to 25 are not limited to those described above, and various types of connectors may be provided on the connector board 20 in accordance with the types of the components provided in the robot control device 330.

The connectors 21 to 25 each is coupled with a corresponding component. For this purpose, the components may include the connector composed of at least one pin. The pin provided in the connector of the component is inserted into the hole provided in the connectors 21 to 25 of the connector board 20, so that physical and electrical coupling is made between the connectors.

The positions of the connectors 21 to 25 on the connector board 20 are determined according to the arrangement of the corresponding component. In the embodiment, the power connector 21 coupled with the power supplier 335 may be disposed at the bottom of the first region A. In addition, the motor driver connector 22 coupled with the motor driver 334 may be disposed above the power supplier 335 in the first region A.

In the embodiment, the processor connector 23 coupled with the processor and the navigation connector 24 coupled with the navigation component 332 may be disposed in a region different from those of the power connector 21 and the motor driver connector 22, that is to say, in the second region B. Here, the navigation connector 24 may be disposed at the top of the second region B.

In the embodiment, the user interface connector 25 coupled with the user interface component 333 may be disposed on the top of the first region A or the second region B. In the shown embodiment, although the user interface connector 25 is disposed in the first region A, the embodiment of the present disclosure is not limited to this, and the user interface connector 25 may be arranged at the top of the second region B.

It can be understood by those skilled in the art that the embodiments can be embodied in other specific forms without departing from its spirit or essential characteristics. Therefore, the foregoing embodiments and advantages are merely exemplary and are not to be construed as limiting the present invention. The scopes of the embodiments are described by the scopes of the following claims rather than by the foregoing description. All modification, alternatives, and variations derived from the scope and the meaning of the scope of the claims and equivalents of the claims should be construed as being included in the scopes of the embodiments.

Various embodiments provide a robot control device of which the minimum number and minimum lengths of cables connecting parts and of which the parts are disposed with efficiency to improve the cooling efficiency and control accuracy, and provide a robot including the robot control device.

One embodiment is a robot control device which control a robot. The robot control device includes a case; and a connector board which is coupled to the case and includes a plurality of connectors which are disposed in a first region and a second region adjacent laterally to the first region. The plurality of the connectors may include: a power connector which is disposed at a bottom of one of the first region and the second region and is coupled with a power supplier; and a processor connector which is disposed in a region different from that of the power supplier and is coupled with a processor.

The plurality of the connectors may further include a navigation connector which is disposed at a top of a region different from that of the power supplier and is coupled with a navigation component. The plurality of the connectors may further include a motor driver connector which is disposed adjacent to the power connector and is coupled with a motor driver.

The plurality of the connectors may further include a user interface connector which is disposed at a top of one of the first region and the second region and is coupled with a user interface component. The plurality of the connectors may further include a sensor connector which is disposed adjacent to the processor connector and is coupled with a sensor component. The processor and the sensor component may be directly connected through a cable. The plurality of the connectors may further include a communication connector which is disposed in one of the first region and the second region and is coupled with a communication component.

The case includes: a first sidewall to which the connector board is coupled; a second sidewall and a third sidewall which are perpendicular to the first sidewall and are spaced apart from each other; and a separation wall which is perpendicular to the first sidewall and is disposed at a boundary between the first region and the second region. The first region may be disposed between the second sidewall and the separation wall, the second region may be disposed between the third sidewall and the separation wall.

The robot control device may further include a plurality of racks which are disposed between the second sidewall and the separation wall and between the separation wall and the third sidewall. The power supplier may be seated on the rack corresponding to the power connector and may be coupled to the power connector. The processor may be seated on the rack corresponding to the processor connector and may be coupled to the processor connector.

Each of the plurality of the racks may include: a sidewall extension which extends vertically from one of the second sidewall and the third sidewall; and a separation wall extension which extends vertically from the separation wall toward one of the second sidewall and the third sidewall. The second sidewall, the third sidewall, and the separation wall may include at least one opening.

The robot control device may further include at least one cooling fan which is coupled to an outside of at least one of the second sidewall and the third sidewall. The connector board may include at least one wiring which electrically connects the power connector with at least one other connector.

Another embodiment is a robot including at least one moving part; at least one motor which applies power to the moving part; and a robot control device which controls the at least one motor. The robot control device may include: a case; a connector board which is coupled to the case and comprises a plurality of connectors which are disposed in a first region and a second region adjacent to the first region; a power supplier which is coupled to the connector board; and a processor which is coupled to the connector board. The plurality of the connectors may include: a power connector which is disposed at a bottom of one of the first region and the second region and is coupled with the power supplier; and a processor connector which is disposed in a region different from that of the power supplier and is coupled with a processor.

The plurality of the connectors may further include a navigation connector which is disposed at a top of a region different from that of the power supplier and is coupled with a navigation component. The plurality of the connectors may further include a motor driver connector which is disposed adjacent to the power connector and is coupled with a motor driver.

The plurality of the connectors may further include a user interface connector which is disposed at a top of one of the first region and the second region and is coupled with a user interface component. The plurality of the connectors may further include a sensor connector which is disposed adjacent to the processor connector and is coupled with a sensor component. The robot may further include a cable which directly connects the processor and the sensor component.

The case may include: a first sidewall to which the connector board is coupled; a second sidewall and a third sidewall which are perpendicular to the first sidewall and are spaced apart from each other; and a separation wall which is perpendicular to the first sidewall and is disposed at a boundary between the first region and the second region. The first region may be disposed between the second sidewall and the separation wall. The second region may be disposed between the third sidewall and the separation wall.

The robot may further include a plurality of racks which are disposed between the second sidewall and the separation wall and between the separation wall and the third sidewall. The power supplier may be seated on the rack corresponding to the power connector and may be coupled to the power connector. The processor may be seated on the rack corresponding to the processor connector and may be coupled to the processor connector.

Further another embodiment is a robot control device which controls a robot. The robot control device includes a case; and a plurality of parts which are disposed in two columns within the case. The plurality of the parts may include: a power supplier which is disposed adjacent to a lower wall of the case in a first column; and a processor which is disposed in a second column.

The plurality of the parts may further include: a navigation component which is disposed at a top of the second column; a motor driver which is disposed above the power connector; a user interface component which is disposed at a top of the first column; and a sensor component which is disposed adjacent to the processor in the second column.

The plurality of the parts may be electrically connected through a connector board. The connector board may include: a first region corresponding to the first column; a second region corresponding to the second column; and a plurality of connectors which are respectively disposed in correspondence with arrangement positions of the parts in the first region and in the second regions.

In the robot control device and the robot including the same according to various embodiment of the present disclosure, the robot has its reduced height, and thus is able to stably drive. In the robot control device and the robot including the same according to various embodiment of the present disclosure, cooling efficiency is enhanced and the number and lengths of cables connecting parts can be minimized and interference between components is minimized, so that the control accuracy can be improved.

In certain implementations, a robot control device for a robot comprises: a case; and a connector board which is coupled to the case and includes a plurality of sockets, a first subset of the sockets being provided in a first region of the connector board, and a second subset of the sockets being provided in a second region of the connector board that is horizontally adjacent to the first region, wherein the sockets include: a power socket which is provided at a lowest position in the first region among the first subset of the sockets and is configured to be coupled to a power supply board; and a processor socket which is included in the second subset of the sockets provided in the second region and is configured to be coupled to a processor board.

The plurality of sockets may further include a navigation socket which provided at a highest position in the second region among the second subset of the sockets and is configured to be coupled to a navigation board. The plurality of sockets may further include a motor driver socket which is provided adjacent to the power socket in the first region and is configured to be coupled to a motor driver board.

The plurality of sockets may further include a user interface socket which is provided at a highest positioned among one of the first or second subsets of the sockets and is configured to be coupled to a user interface board. The plurality of sockets may further include a sensor socket which is provided adjacent to the processor socket in the second region and is configured to be coupled to a sensor board, and the processor board and the sensor board may be configured to be connected separately of the connector board. The plurality of sockets may further include a communication socket which is disposed in one of the first region and the second region and is configured to be coupled to a communication board.

The case may include: a first sidewall to which the connector board is coupled; a second sidewall and a third sidewall which extend perpendicular to the first sidewall and are spaced apart from each other; and a separation wall which extend perpendicular to the first sidewall and between the second sidewall and the third sidewall, an end of the separation wall being positioned at a boundary between the first region and the second region, wherein the first region is provided between an end of the second sidewall and the end of the separation wall, and wherein the second region is provided between an end of the third sidewall and the end of the separation wall.

The robot control device may further comprise a plurality of racks which are each provided between the separation wall and one of the second sidewall or the third sidewall. The power supply board may be seated on one of the plurality of racks corresponding to the power socket and may be coupled to the power socket, and the processor board may be seated on another one of the plurality of racks corresponding to the processor socket and may be coupled to the processor socket.

Each of the plurality of racks may include: a first extension which extends horizontally from one of the second sidewall or the third sidewall; and a second extension which extends horizontally from the separation wall and toward the one of the second sidewall and the third sidewall. Each of the second sidewall, the third sidewall, and the separation wall may include at least one opening.

The robot control device may further comprise at least one cooling fan which is coupled to an outside surface of at least one of the second sidewall or the third sidewall. The connector board may electrically connect the power socket with at least one other one of the plurality of sockets.

In certain implementations, a robot may comprise: at least one moving wheel; and a control device which controls the at least one moving wheel, wherein the control device includes: a chassis; a connector board which is coupled to the chassis and includes a plurality of sockets, each of the sockets being positioned in one of a first region of the connector board or a second region of the connector board; a power supply board which is coupled to the connector board; and a processor board which is coupled to the connector board, and wherein the plurality of sockets include: a power socket which is positioned a lowest location on the connector board among a first subset of the sockets positioned in the first region and is coupled to the power supply board; and a processor socket which is positioned in the second region and is coupled to a processor board.

The plurality of sockets may further include a navigation socket which is positioned a highest location on the connector board among a second subset of the sockets positioned in the second region and is coupled to a navigation board. The plurality of sockets may further include a motor driver socket which is vertically adjacent to the power socket and is coupled to a motor driver board. The plurality of sockets may further include a user interface socket which may be positioned at a top of one of the first region and the second region and may be coupled to a user interface board. The plurality of sockets may further include a sensor socket which is positioned vertically adjacent to the processor socket and is coupled to a sensor board, and the processor board and the sensor board may be connected to each other separately from the connector board.

The chassis may include: a first sidewall to which the socket board is coupled; a second sidewall and a third sidewall which extend perpendicular to the first sidewall and are spaced apart from each other; and a separation wall which extends perpendicular to the first sidewall and is positioned between the first and second sidewalls at a boundary between the first region and the second region, wherein the first region is provided between an end of the second sidewall and an end of the separation wall, and wherein the second region is provided between an end of the third sidewall and the end of the separation wall.

The robot may further comprise a plurality of racks which are each provided between the separation wall and one of the second side all or the third sidewall. The power supplier may be seated one of the racks corresponding to the power socket and coupled to the power socket, and the processor may seated on one of the racks corresponding to the processor socket and coupled to the processor socket.

In certain implementations, a robot control device which controls a robot may comprise: a case; and a plurality of boards which are positioned in first and second columns within the case, wherein the plurality of boards include: a power supply board which is positioned adjacent to a lower wall of the case in the first column; and a processor board which is positioned in the second column.

The plurality of boards may further include: a navigation board which is positioned at a top of the second column; a motor driver board which is positioned above the power connector board; a user interface board which is positioned at a top of the first column; and a sensor board which is positioned adjacent to the processor in the second column.

The plurality of boards may be electrically connected through a bus, and the bus may include: a first region corresponding to the first column; a second region corresponding to the second column; and a plurality of ports which are respectively positioned in the first region and in the second region to correspond to positions of the plurality of boards.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A robot control device for a robot, the robot control device comprising:

a case; and a connector board which is coupled to the case and includes a plurality of sockets, a first subset of the sockets being provided in a first region of the connector board, and a second subset of the sockets being provided in a second region of the connector board that is adjacent laterally to the first region, wherein the sockets include:

a power socket which is provided at a bottom of the first region and is configured to be coupled to a power supply board; and a processor socket which is included in the second subset of the sockets provided in the second region and is configured to be coupled to a processor board.

2. The robot control device of claim 1, wherein the plurality of sockets further include a navigation socket which provided at a highest position in the second region among the second subset of the sockets and is configured to be coupled to a navigation board.

3. The robot control device of claim 1, wherein the plurality of sockets further include a motor driver socket which is provided adjacent to the power socket in the first region and is configured to be coupled to a motor driver board.

4. The robot control device of claim 1, wherein the plurality of sockets further include a user interface socket which is provided at a highest positioned among one of the first or second subsets of the sockets and is configured to be coupled to a user interface board.

5. The robot control device of claim 1, wherein the plurality of sockets further include a sensor socket which is provided adjacent to the processor socket in the second region and is configured to be coupled to a sensor board, and wherein the processor board and the sensor board are configured to be connected separately of the connector board.

6. The robot control device of claim 1, wherein the plurality of sockets further include a communication socket which is disposed in one of the first region and the second region and is configured to be coupled to a communication board.

7. The robot control device of claim 1, wherein the case includes:
  a first sidewall to which the connector board is coupled;
  a second sidewall and a third sidewall which extend perpendicular to the first sidewall and are spaced apart from each other; and
  a separation wall which extend perpendicular to the first sidewall and between the second sidewall and the third sidewall, an end of the separation wall being positioned at a boundary between the first region and the second region,
  wherein the first region is provided between an end of the second sidewall and the end of the separation wall, and
  wherein the second region is provided between an end of the third sidewall and the end of the separation wall.

8. The robot control device of claim 7, further comprising a plurality of racks which are each provided between the separation wall and one of the second sidewall or the third sidewall.

9. The robot control device of claim 8,
  wherein the power supply board is seated on one of the plurality of racks corresponding to the power socket and is coupled to the power socket, and
  wherein the processor board is seated on another one of the plurality of racks corresponding to the processor socket and is coupled to the processor socket.

10. The robot control device of claim 8, wherein each of the plurality of racks include:
  a first extension which extends horizontally from one of the second sidewall or the third sidewall; and
  a second extension which extends horizontally from the separation wall and toward the one of the second sidewall and the third sidewall.

11. The robot control device of claim 7, wherein each of the second sidewall, the third sidewall, and the separation wall includes at least one opening.

12. The robot control device of claim 7, further comprising at least one cooling fan which is coupled to an outside surface of at least one of the second sidewall or the third sidewall.

13. The robot control device of claim 1, wherein the connector board electrically connects the power socket with at least one other one of the plurality of sockets.

14. A robot comprising:
  at least one moving wheel; and
  a control device which controls the at least one moving wheel,
  wherein the control device includes:
    a chassis;
    a connector board which is coupled to the chassis and includes a plurality of sockets, each of the sockets being positioned in one of a first region of the connector board or a second region of the connector board that is adjacent to the first region;
    a power supply board which is coupled to the connector board; and
    a processor board which is coupled to the connector board, and
  wherein the plurality of sockets include:
    a power socket which is positioned at a bottom of the first region and is configured to be coupled to the power supply board; and
    a processor socket which is positioned in the second region and is configured to be coupled to a processor board.

15. The robot of claim 14, wherein the plurality of sockets further include a navigation socket which is positioned a highest location in the second region and is configured to be coupled to a navigation board.

16. The robot of claim 14, wherein the plurality of sockets further include a motor driver socket which is positioned vertically adjacent to the power socket and is configured to be coupled to a motor driver board.

17. The robot of claim 14, wherein the plurality of sockets further include a user interface socket which is positioned at a top of one of the first region or the second region and is configured to be coupled to a user interface board.

18. The robot of claim 14,
  wherein the plurality of sockets further include a sensor socket which is positioned adjacent to the processor socket and is configured to be coupled to a sensor board, and
  wherein the processor board and the sensor board are connected together separately from the connector board.

19. The robot of claim 14, wherein the chassis includes:
  a first sidewall to which the socket board is coupled;
  a second sidewall and a third sidewall which extend perpendicular to the first sidewall and are spaced apart from each other; and
  a separation wall which extends perpendicular to the first sidewall and is positioned between the first and second sidewalls at a boundary between the first region and the second region,
  wherein the first region is provided between an end of the second sidewall and an end of the separation wall, and
  wherein the second region is provided between an end of the third sidewall and the end of the separation wall.

20. The robot of claim 19, further comprising a plurality of racks which are each provided between the separation wall and one of the second side all or the third sidewall.

21. The robot of claim 20,
  wherein the power supplier is seated on one of the racks corresponding to the power socket and is configured to be coupled to the power socket, and
  wherein the processor is seated on one of the racks corresponding to the processor socket and is configured to be coupled to the processor socket.

* * * * *